(12) United States Patent
Kim et al.

(10) Patent No.: US 9,159,779 B2
(45) Date of Patent: Oct. 13, 2015

(54) METHOD OF FABRICATING SEMICONDUCTOR DEVICE

(75) Inventors: Beom-Yong Kim, Gyeonggi-do (KR);
Yun-Hyuck Ji, Gyeonggi-do (KR);
Seung-Mi Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 167 days.

(21) Appl. No.: 13/617,305

(22) Filed: Sep. 14, 2012

(65) Prior Publication Data
US 2014/0004679 A1   Jan. 2, 2014

(30) Foreign Application Priority Data
Jun. 29, 2012   (KR) ................ 10-2012-0070952

(51) Int. Cl.
*H01L 21/28* (2006.01)
*H01L 21/768* (2006.01)
*H01L 49/02* (2006.01)
*H01L 29/66* (2006.01)
*H01L 29/94* (2006.01)

(52) U.S. Cl.
CPC .............. *H01L 28/40* (2013.01); *H01L 21/768* (2013.01); *H01L 28/60* (2013.01); *H01L 29/66477* (2013.01); *H01L 29/94* (2013.01); *H01L 21/76864* (2013.01); *H01L 28/92* (2013.01)

(58) Field of Classification Search
CPC ......... H01L 28/40; H01L 28/60; H01L 28/92; H01L 21/768; H01L 29/66477; H01L 29/94
USPC ......... 438/660, 663, 585, 656, 648, 381, 592, 438/595
See application file for complete search history.

(56) References Cited

U.S. PATENT DOCUMENTS

| | | | | |
|---|---|---|---|---|
| 4,811,076 A * | 3/1989 | Tigelaar et al. | ............... | 257/306 |
| 4,811,078 A * | 3/1989 | Tigelaar et al. | ............... | 257/311 |
| 4,894,693 A * | 1/1990 | Tigelaar et al. | ............... | 257/311 |
| 5,925,225 A | 7/1999 | Ngan et al. | | |
| 6,004,853 A * | 12/1999 | Yang et al. | ..................... | 438/305 |
| 6,245,652 B1 * | 6/2001 | Gardner et al. | ............... | 438/592 |
| 6,261,934 B1 * | 7/2001 | Kraft et al. | .................... | 438/592 |
| 6,277,719 B1 * | 8/2001 | Chern et al. | .................. | 438/585 |
| 6,297,170 B1 * | 10/2001 | Gabriel et al. | ................ | 438/738 |
| 6,511,911 B1 * | 1/2003 | Besser et al. | .................. | 438/656 |
| 6,573,132 B1 * | 6/2003 | Uehara et al. | ................. | 438/211 |
| 6,762,091 B2 * | 7/2004 | Joo et al. | ....................... | 438/253 |
| 6,774,462 B2 * | 8/2004 | Tanaka et al. | ................. | 257/639 |
| 6,936,529 B2 * | 8/2005 | Lim et al. | ...................... | 438/585 |
| 7,029,999 B2 * | 4/2006 | Lim et al. | ...................... | 438/585 |
| 7,101,777 B2 * | 9/2006 | Ho et al. | ....................... | 438/592 |
| 7,154,779 B2 * | 12/2006 | Mokhlesi et al. | ......... | 365/185.01 |
| 7,326,988 B2 * | 2/2008 | Yamamoto | .................... | 257/310 |
| 7,534,709 B2 * | 5/2009 | Park et al. | ..................... | 438/592 |
| 7,618,852 B2 * | 11/2009 | Jang et al. | ..................... | 438/149 |
| 7,674,710 B2 * | 3/2010 | Ashigaki et al. | .............. | 438/648 |
| 7,741,202 B2 * | 6/2010 | Clark | ............................ | 438/585 |

(Continued)

FOREIGN PATENT DOCUMENTS

KR   1020000041427   7/2000
KR   1020040091354   10/2004

*Primary Examiner* — Mary Wilczewski
(74) *Attorney, Agent, or Firm* — IP & T Group LLP

(57) ABSTRACT

A method for fabricating a semiconductor device includes forming a metal layer over a substrate, forming a capping layer over the metal layer, and densifying the metal layer through a heat treatment.

7 Claims, 13 Drawing Sheets

(56) References Cited

U.S. PATENT DOCUMENTS

| | | | |
|---|---|---|---|
| 8,022,465 B2* | 9/2011 | Shih et al. | 257/324 |
| 8,309,419 B2* | 11/2012 | Schaeffer et al. | 438/287 |
| 8,835,291 B2* | 9/2014 | Huang et al. | 438/585 |
| 2002/0052124 A1* | 5/2002 | Raaijmakers et al. | 438/778 |
| 2002/0081826 A1* | 6/2002 | Rotondaro et al. | 438/585 |
| 2002/0086507 A1* | 7/2002 | Park et al. | 438/585 |
| 2002/0146881 A1* | 10/2002 | Joo et al. | 438/240 |
| 2003/0129817 A1* | 7/2003 | Visokay et al. | 438/591 |
| 2003/0215986 A1* | 11/2003 | Graf et al. | 438/142 |
| 2004/0004242 A1* | 1/2004 | Yamamoto | 257/310 |
| 2004/0219772 A1* | 11/2004 | You et al. | 438/585 |
| 2004/0266151 A1* | 12/2004 | Lim et al. | 438/585 |
| 2005/0051854 A1* | 3/2005 | Cabral et al. | 257/407 |
| 2009/0227078 A1* | 9/2009 | Chen et al. | 438/199 |
| 2009/0325369 A1* | 12/2009 | Kim et al. | 438/585 |
| 2010/0197128 A1* | 8/2010 | Schaeffer et al. | 438/591 |
| 2014/0004679 A1* | 1/2014 | Kim et al. | 438/381 |
| 2014/0065808 A1* | 3/2014 | Grass et al. | 438/585 |

* cited by examiner

FIG. 8

| | COMPARATIVE EMBODIMENT | THIS EMBODIMENT |
|---|---|---|
| AFM 3D image | | |
| p-v(nm) | 2.833 | 1.546 |
| RMS(nm) | 0.251 | 0.155 |

METHOD OF FABRICATING SEMICONDUCTOR DEVICE

CROSS-REFERENCE TO RELATED APPLICATIONS

The present application claims priority of Korean Patent Application No. 10-2012-0070952, filed on Jun. 29, 2012, which is incorporated herein by reference in its entirety.

BACKGROUND

1. Field

Exemplary embodiments of the present invention relate to a semiconductor device, and more particularly, to a method for removing a defect of a metal layer and a method for fabricating a semiconductor device using the same.

2. Description of the Related Art

With the increase in integration degree of a semiconductor device, the difficulty level in fabricating the semiconductor device has also increased to approach its limit. DRAM, for example, may decrease the thickness of a high-k dielectric layer with the increase in the integration degree. Accordingly, a serious leakage current may occur. The leakage current is significantly affected by properties and interface defects of a metal layer as well as the dielectric layer forming a capacitor.

FIG. 1 is a transmission electron microscopy (TEM) photograph showing a metal layer of a conventional capacitor.

Referring to FIG. 1, the surface roughness of titanium nitride used as the metal layer of the capacitor is high, and uneven poly-crystal grains and micro-defects are found.

In particular, in a stacked structure of a high-k dielectric layer and a metal layer, the layers may contain a lot of defects and impurities occurring during a layer formation process. The defects and impurities may cause a secondary consideration.

FIGS. 2 and 3 are cross-sectional views illustrating features of a conventional stacked structure of the metal layer and the high-k dielectric layer.

Referring to FIG. 2, defects such as dangling bonds may be formed in the metal layer during the layer formation and easily react with oxygen contained in the high-k dielectric layer. Accordingly, the oxygen escapes from the high-k dielectric layer to make vacancy defects inside the high-k dielectric layer. As a result, a leakage current occurs.

Referring to FIG. 3, a metal layer having a columnar structure has low energy at a grain boundary in a vertical direction, and the metal layer provides a path through which oxygen escapes much more easily. Accordingly, defects may increase. Furthermore, a large amount of carbon contained in the high-k dielectric layer and the metal layer easily reacts with oxygen, and the oxygen easily escapes through the grain boundary. Therefore, the occurrence of oxygen vacancies is accelerated. As a result, a leakage current occurs.

In order to improve the property of the metal layer or the high-k dielectric layer, a heat treatment is performed after the metal layer is formed. However, during the heat treatment, the occurrence of oxygen vacancies may be accelerated. Accordingly, even if the heat treatment is performed at an oxygen atmosphere to suppress the occurrence of oxygen vacancies, interface oxidation may occur due to permeation of the external oxygen. In this case, resistance may increase.

SUMMARY

An embodiment of the present invention is directed to a method for fabricating a semiconductor device, which is capable of preventing the occurrence of leakage currents and improving the ranges of its characteristics by reducing defects of a metal layer included therein.

In accordance with an embodiment of the present invention, a method for fabricating a semiconductor device includes: forming a metal layer over a substrate; forming a capping layer over the metal layer; and densifying the metal layer through a heat treatment.

In accordance with another embodiment of the present invention, a method for fabricating a semiconductor device includes: forming a gate dielectric layer over a substrate; forming a metal layer over the gate dielectric layer; forming a capping layer over the metal layer; densifying the metal layer through a heat treatment; removing the capping layer; and forming a gate pattern by etching the metal layer and the gate dielectric layer.

In accordance with yet another embodiment of the present invention, a method for fabricating a capacitor includes: forming a lower electrode; forming a dielectric layer over the lower electrode; forming an upper electrode metal layer over the dielectric layer; forming an upper electrode capping layer over the upper electrode metal layer; densifying the upper electrode metal layer through a first heat treatment; removing the upper electrode capping layer; and forming an upper electrode by etching the upper electrode metal layer.

BRIEF DESCRIPTION OF THE DRAWINGS

FIG. 8 is an atomic force microscope (AFM) diagram for comparing the surface roughnesses of the metal layers in accordance with the comparative embodiment and the embodiment of the present invention.

DETAILED DESCRIPTION

Figure 1:
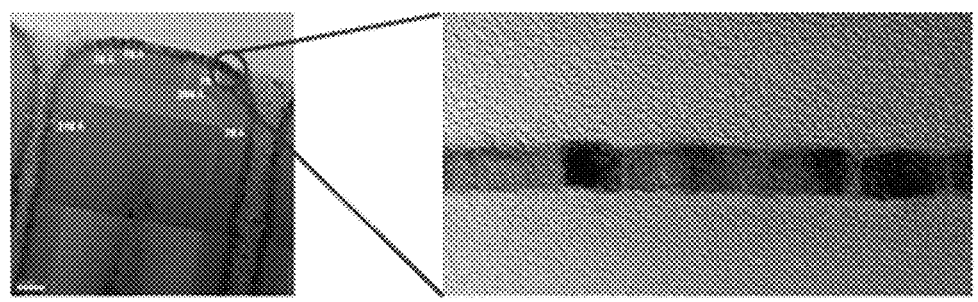
FIG. 1 is a TEM photograph showing a metal layer of a conventional capacitor.
Figure 2:
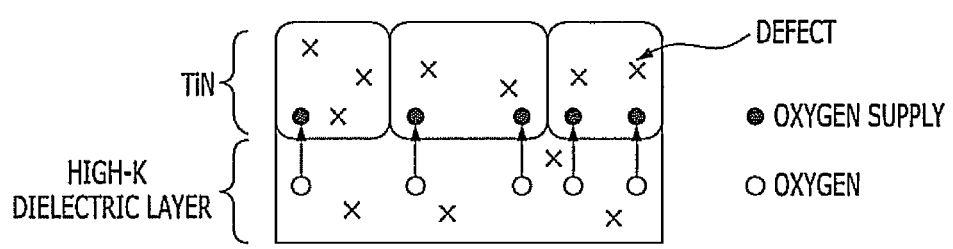
FIGS. 2 and 3 are cross-sectional views illustrating features of a conventional stacked structure of the metal layer and the high-k dielectric layer.
Figure 3:
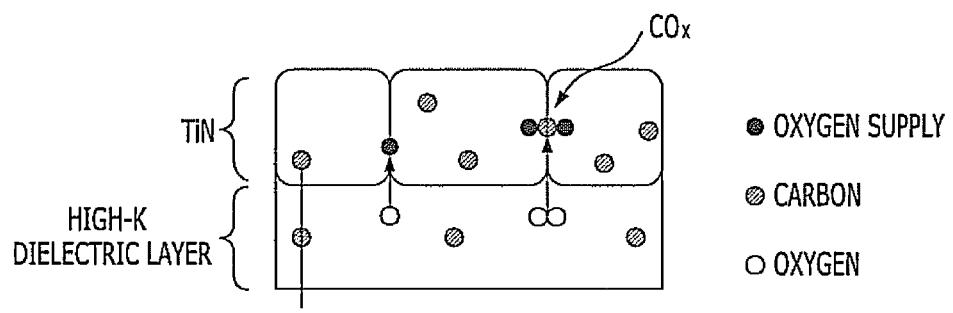

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 4A to 4D are cross-sectional views illustrating a method for fabricating a metal layer in accordance with an embodiment of the present invention.

Figure 4A:
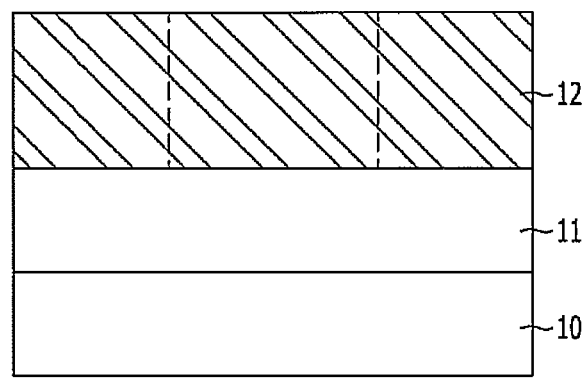
FIGS. 4A to 4D are cross-sectional views illustrating a method for fabricating a metal layer in accordance with an embodiment of the present invention.

Referring to FIG. 4A, a high-k dielectric layer 11 is formed over a semiconductor substrate 10.

The high-k dielectric layer 11 may serve as an insulating layer of a conductive pattern or a dielectric layer of a capacitor. The high-k dielectric layer 11 may be formed of metal oxide. The metal oxide may include two compounds selected from the group consisting of $TiO_2$, $Ta_2O_3$, $HfO_3$, $Al_2O_3$, $ZrO_2$, LaO, NbO, and CeO. Alternatively, the metal oxide may include three compounds selected from the group consisting of HfSiO, ZrSiO, LaSiO, DySiO, GdSiO, YSiO, CeSiO, PrSiO, HfAlO, ZrAlO, DyScO, GdAlO, YAlO, NdAlO, CeAlO, and PrAlO.

The high-k dielectric layer 11 may be formed by chemical vapor deposition (CVD) or atomic layer deposition (ALD).

A metal layer 12 is formed over the high-k dielectric layer 11. The metal layer 12 may serve as an electrode of a conductive pattern or an upper/lower electrode of a capacitor. The metal layer 12 may be formed of a material having a columnar grain boundary. The metal layer 12 may include TiN or a stacked structure of TiN/Ti.

The metal layer 12 is formed to have a uniform thickness, in order to provide considerable step coverage. For example, the metal layer 12 may be formed by ALD.

As described above, since the metal layer 12 having a columnar grain boundary has low energy at a vertical grain boundary, the metal layer 12 provides a path through which oxygen escapes, thereby causing defects. Furthermore, a large amount of carbon (C) contained in the high-k dielectric layer 11 and the metal layer 12 easily reacts with oxygen and the oxygen may easily escape through the grain boundary, thereby accelerating the occurrence of oxygen vacancies. Furthermore, when a heat treatment is performed, the occurrence of oxygen vacancies may be further accelerated.

Figure 4B:
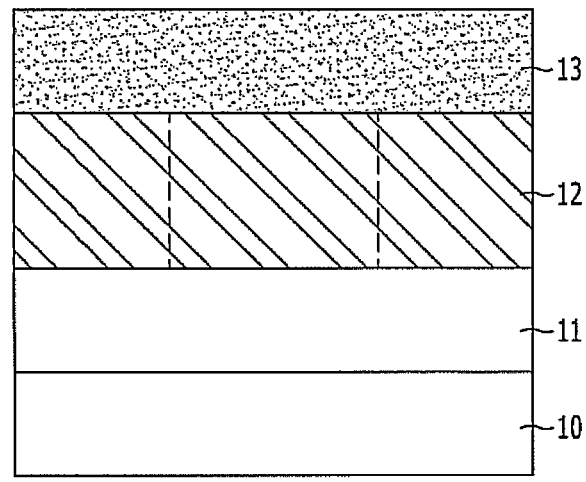

Therefore, in this embodiment of the present invention, a capping layer 13 is formed over the metal layer 12, as illustrated in FIG. 4B. The capping layer 13 may serve as a barrier capable of preventing oxygen vacancies from occurring in the high-k dielectric layer 11, and it may be formed of a material which may be easily removed. For example, the capping layer 13 contains oxygen and may be formed at a temperature where the oxygen does not react with the materials of the metal layer 12 and the high-k dielectric layer 11.

The capping layer 13 includes oxide. More specifically, the capping layer 13 includes low temperature oxide formed at a temperature of approximately 10° C. to 100° C., for example, low temperature oxide (LTO) or ultra-low temperature oxide (ULTO). Furthermore, the capping layer 13 may be formed by ALD to have excellent step coverage, so that the capping layer 13 may be uniformly deposited on the metal layer.

As such, the capping layer 13 formed of low temperature oxide does not react with the metal layer 12 and the high-k dielectric layer 11, because the deposition temperature thereof is low. Therefore, the capping layer 13 does not have an effect on the properties of the metal layer 12 and the high-k dielectric layer 11. Furthermore, since the capping layer 13 has low density, the capping layer 13 has a high etch rate and is easily removed.

Figure 4C:
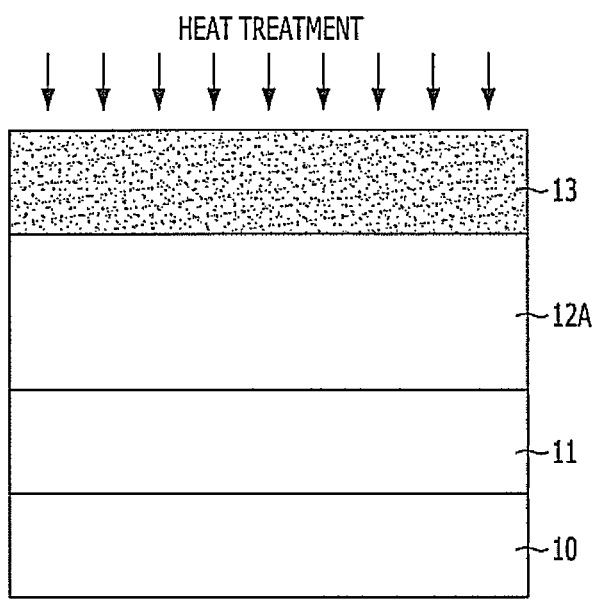

Referring to FIG. 4C, a heat treatment is performed to densify the metal layer 12A. The heat treatment may be performed at a nitrogen ($N_2$) atmosphere by rapid thermal annealing (RTA) equipment. Furthermore, the heat treatment may be performed at a temperature of approximately 400° C. to 700° C.

As the metal layer 12A is densified by the heat treatment, the surface roughness of the metal layer 12A and the unevenness of the grain boundary may be improved, and defects may be removed. Furthermore, since the capping layer 13 formed over the metal layer 12A serves as an oxygen barrier of the high-k dielectric layer 11 during the heat treatment, oxygen vacancies may be prevented from occurring in the high-k dielectric layer 11.

Figure 4D:
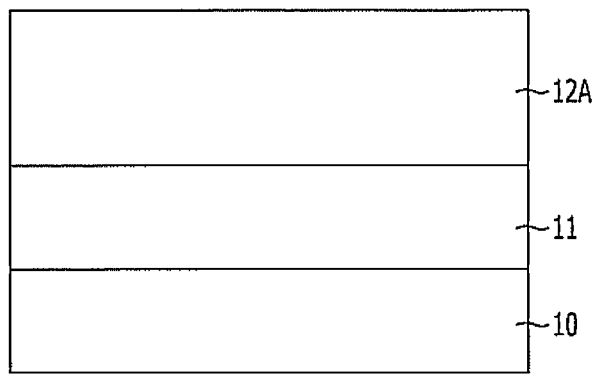

Referring to FIG. 4D, the capping layer 13 is removed. The capping layer 13 may be removed by wet cleaning, and the wet cleaning may be performed using HF, for example. In particular, since the capping layer 13 has low density, the capping layer 13 has a high etch rate and is easily removed.

As a result, defects of the metal layer 12A and the high-k dielectric layer 11 may be reduced, and electrical characteristics such as Rs resistance and leakage current may be improved, without having an effect on a capacitance equivalent thickness (CET).

FIGS. 5A to 5E are cross-sectional views illustrating a method for fabricating a capacitor including a metal layer in accordance with another embodiment of the present invention.

Figure 5A:
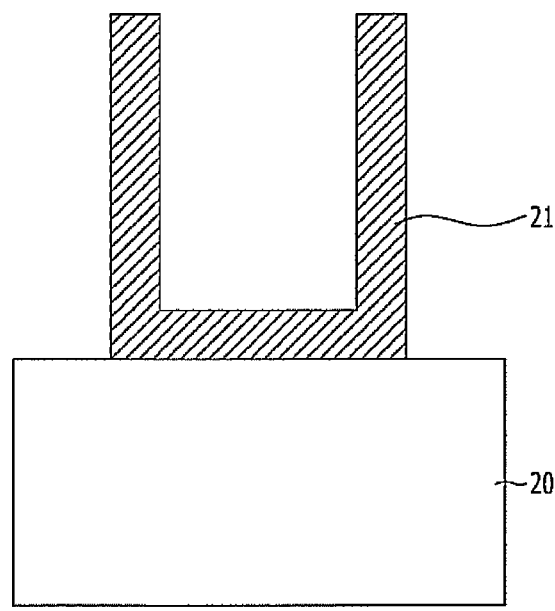
FIGS. 5A to 5E are cross-sectional views illustrating a method for fabricating a capacitor including a metal layer in accordance with another embodiment of the present invention.

Referring to FIG. 5A, a lower electrode 21 is formed over a semiconductor substrate 20. The semiconductor substrate 20 includes a silicon-containing material. For example, the semiconductor substrate 20 may include a silicon substrate, a silicon germanium substrate and the like. The semiconductor substrate 20 may include a substrate in which transistor and interconnection processes are already completed, and it may have a given pattern and an interlayer dielectric layer formed thereon. Furthermore, the semiconductor substrate 20 may include a contact plug (not illustrated) connected to the substrate by passing through the interlayer dielectric layer.

The lower electrode 21 may be formed of metal, metal nitride, or a stacked layer of metal and metal nitride. The lower electrode 21 may be formed by CVD or ALD. For example, the lower electrode 21 may be formed of TI, TiN, or a stacked layer of Ti and TiN.

More specifically, the process of forming the lower electrode 21 is performed as follows. First, a lower electrode metal layer is formed over the semiconductor substrate. Then, a lower electrode capping layer is formed over the lower electrode metal layer. At this time, the lower electrode capping layer may include oxide formed at a temperature of approximately 10° C. to 100° C. Then, the lower electrode metal layer is densified through a heat treatment. At this time, the heat treatment for densification may be performed at a temperature of approximately 400° C. to 700° C. by RTA equipment within one minute. Then, the lower electrode capping layer is removed. The lower electrode capping layer may be removed by wet etching. Finally, the lower electrode metal layer is etched to form the lower electrode.

The lower electrode 21 may be formed as a concave, cylinder, pillar, or planar type of capacitor electrode structure. In this embodiment of the present invention, the cylinder-type lower electrode 21 is illustrated for description purposes.

Figure 5B:
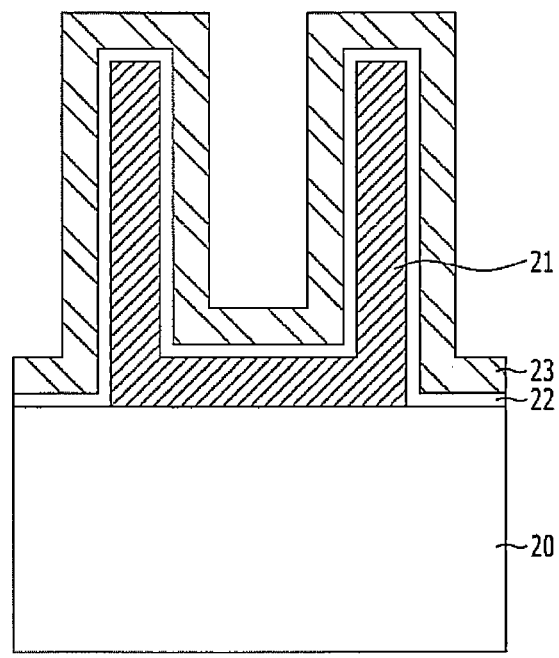

Referring to FIG. 5B, a dielectric layer 22 is formed on the entire surface of the resultant structure including the lower electrode 21.

The dielectric layer 22 may include metal oxide. The metal oxide may include two compounds selected from the group consisting of $TiO_2$, $Ta_2O_3$, $HfO_3$, $Al_2O_3$, $ZrO_2$, LaO, NbO, and CeO. Alternatively, the metal oxide may include three compounds selected from the group consisting of HfSiO, ZrSiO, LaSiO, DySiO, GdSiO, YSiO, CeSiO, PrSiO, HfAlO, ZrAlO, DyScO, GdAlO, YAlO, NdAlO, CeAlO, and PrAlO.

The dielectric layer 22 may be formed by CVD or ALD.

An upper electrode metal layer 23 is formed over the dielectric layer 22. The upper electrode metal layer 23 may include a material having a columnar grain boundary. The upper electrode metal layer 23 may include TiN, for example. The upper electrode metal layer 23 is formed to have a uniform thickness, in order to provide considerable step coverage. For example, the upper electrode metal layer 23 may be formed by ALD. The upper electrode metal layer 23 may be formed to have a thickness of 10 nm or less.

Figure 5C:
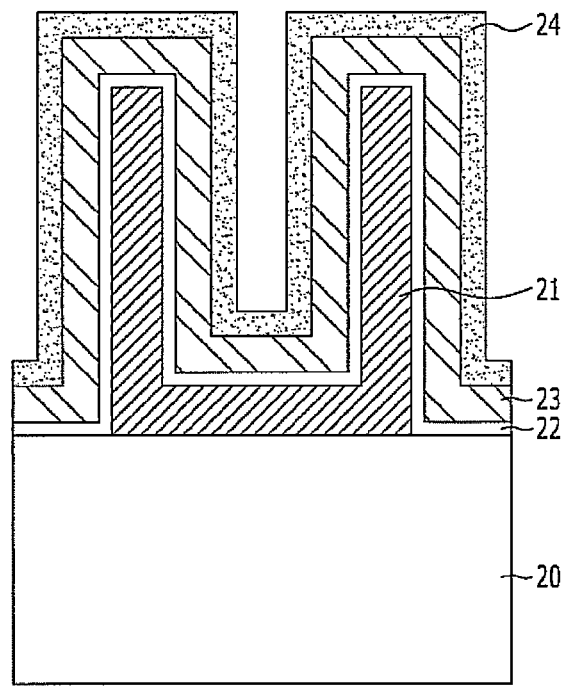

Referring to FIG. 5C, an upper electrode capping layer 24 is formed over the upper electrode metal layer 23. The upper electrode capping layer 24 is formed of a material which may serve as a barrier capable of preventing oxygen vacancies from occurring within the dielectric layer 22 and may be easily removed. The upper electrode capping layer 24 contains oxygen, and it may be formed at a temperature where the oxygen does not react with the materials of the upper electrode metal layer 23 and the dielectric layer 22.

The upper electrode capping layer 24 may include oxide. The upper electrode capping layer 24 may include low temperature oxide formed at a temperature of approximately 10° C. to 100° C., for example, LTO or ULTO. Furthermore, the upper electrode capping layer 24 may be formed by ALD to have excellent step coverage, so that the upper electrode capping layer 24 may be uniformly deposited on the upper electrode metal layer 23. The upper electrode capping layer 24 may be formed to have a thickness of 20 nm or less.

As described above, the upper electrode capping layer 24 is formed at a low deposition temperature, i.e., approximately 10° C. to 100° C., and thus it does not react with the upper electrode metal layer 23 and the dielectric layer 22. Therefore, the upper electrode capping layer 24 does not have an effect on the property of the upper electrode metal layer 23 and the dielectric layer 22. Furthermore, since the upper electrode capping layer 24 has low density, the upper electrode capping layer 24 has a high etch rate and is easily removed.

Figure 5D:
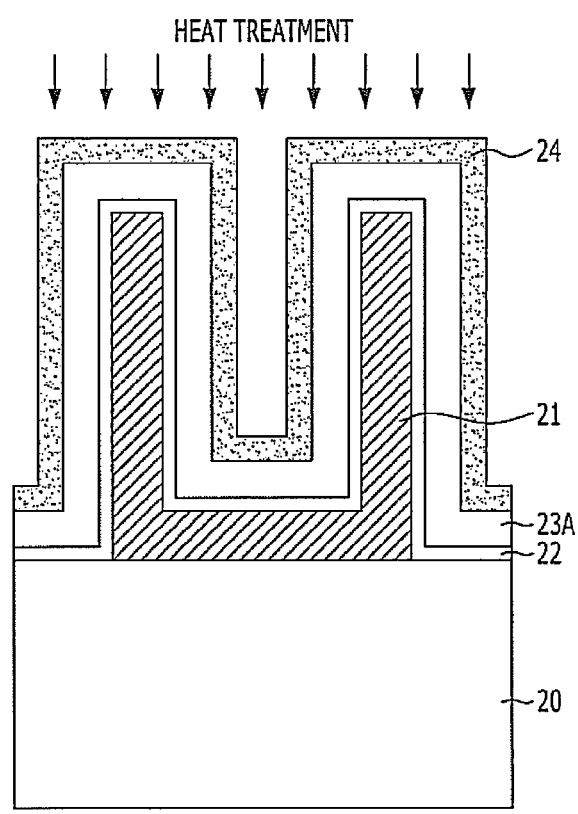

Referring to FIG. 5D, a heat treatment is performed to densify the upper electrode metal layer 23A. The heat treatment may be performed at a nitrogen ($N_2$) atmosphere by RTA equipment. Furthermore, the heat treatment may be performed at a temperature of approximately 400° C. to 700° C. At this time, the heat treatment may be performed within one minute.

As the upper electrode metal layer 23A is densified by the heat treatment, the surface roughness of the upper electrode metal layer 23A and the unevenness of the grain boundary may be improved, and defects may be removed. Furthermore, since the upper electrode capping layer 24 formed over the upper electrode metal layer 23A serves as an oxygen barrier of the dielectric layer 22 during the heat treatment, oxygen vacancies may be prevented from occurring in the dielectric layer 22.

Figure 5E:
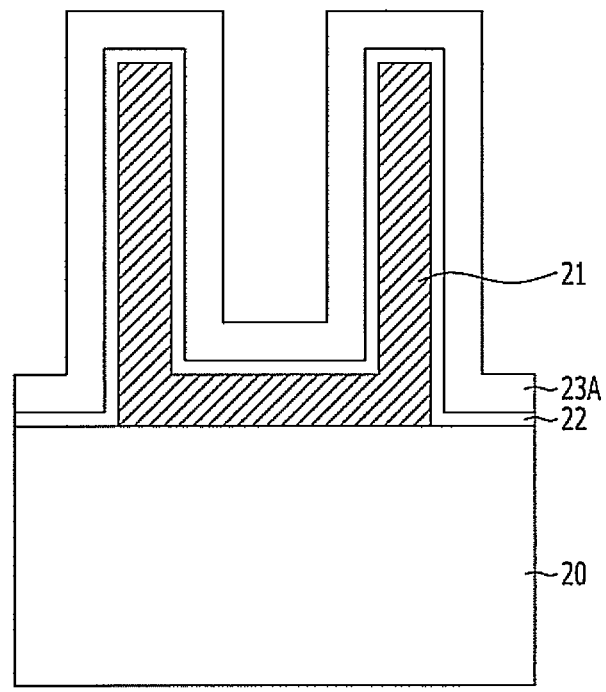

Referring to FIG. 5E, the upper electrode capping layer 24 is removed. The upper electrode capping layer 24 may be removed by wet cleaning, and the wet cleaning may be performed using Hydrofluoric acid (HF), for example. In particular, since the upper electrode capping layer 24 has low density, the upper electrode capping layer 24 has a high etch rate and is easily removed.

Subsequently, a metal layer may be additionally deposited on the upper electrode metal layer 24 so as to perform gap-filling. At this time, the additionally-deposited metal layer may be formed to have a thickness of 30 nm or less. Furthermore, the upper electrode metal layer 23A and the additionally-deposited metal layer may be etched to form an upper electrode.

As a result, while reducing defects of the upper electrode metal layer 24 and the dielectric layer 22, a capacitor including the upper electrode metal layer 24 and the dielectric layer 22 may improve its electrical characteristics such as Rs resistance and leakage current, without having an effect on the CET.

FIGS. 6A to 6E are cross-sectional views illustrating a method for fabricating a semiconductor device including a metal layer in accordance with another embodiment of the present invention.

Figure 6A:
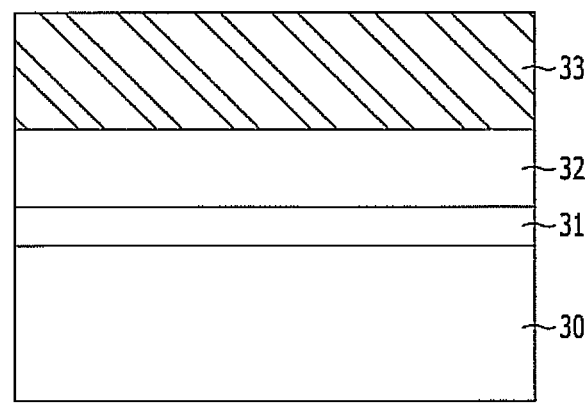
FIGS. 6A to 6E are cross-sectional views illustrating a method for fabricating a semiconductor device including a metal layer in accordance with another embodiment of the present invention.

Referring to FIG. 6A, an interface layer 31 is formed over a semiconductor substrate 30.

The semiconductor substrate 20 is formed of a silicon-containing material, and it may include a silicon substrate, a silicon germanium substrate and the like, for example. The interface layer 31 may include oxide, and the oxide may include silicon oxide ($SiO_2$). The interface layer 31 may be formed by dry oxidation or wet oxidation. The interface layer 31 may be formed to have a thickness of 1.2 nm or less.

Then, a gate dielectric layer 32 is formed over the interface layer 31. The gate dielectric layer 32 may be formed of metal oxide. The metal oxide may include two compounds selected from the group consisting of $TiO_2$, $Ta_2O_3$, $HfO_3$, $Al_2O_3$, $ZrO_2$, LaO, NbO, and CeO. Alternatively, the metal oxide may include three compounds selected from the group consisting of HfSiO, ZrSiO, LaSiO, DySiO, GdSiO, YSiO, CeSiO, PrSiO, HfAlO, ZrAlO, DyScO, GdAlO, YAlO, NdAlO, CeAlO, and PrAlO.

The gate dielectric layer 32 may be formed by a deposition method such as CVD, ALD, or physical vapor deposition (PVD).

After the gate dielectric layer 32 is formed, nitridation and RTA may be additionally performed.

A conductive layer 33 is formed over the gate dielectric layer 32. The conductive layer 33 serves as an electrode of a conductive pattern. The conductive layer 33 may be formed of a metal or metal nitride. The conductive layer 33 may include at least one selected from the group consisting of TI, TiN, Ta, and TaN. Furthermore, after the conductive layer 33 is formed, a composition ratio of the conductive layer 33 may be controlled by a post treatment at a carbon (C) and nitrogen (N) atmosphere.

Figure 6B:
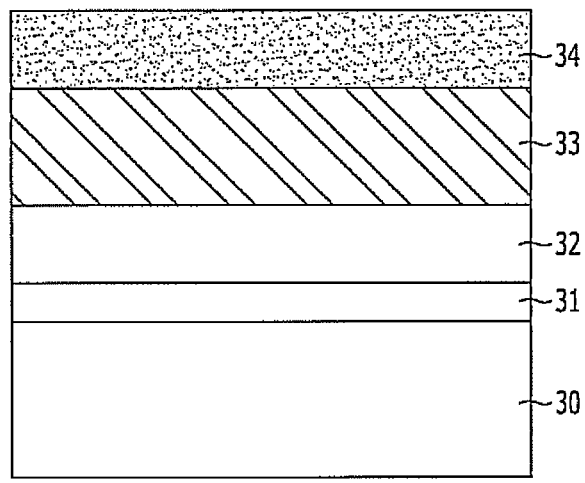

Referring to FIG. 6B, a capping layer 34 is formed over the conductive layer 33. The capping layer 34 is formed of a material which may serve as a barrier capable of preventing oxygen vacancies from occurring inside the gate dielectric layer 32 and may be easily removed. The capping layer 34 contains oxygen, and it may be formed at a temperature where the oxygen does not react with the materials of the conductive layer 33 and the gate dielectric layer 32.

The capping layer 34 may include oxide. More specifically, the capping layer 34 may include low temperature oxide formed at a temperature of approximately 10° C. to 100° C., for example, LTO or ULTO. Furthermore, the capping layer 34 may be formed by ALD to have excellent step coverage, so that the capping layer 34 may be uniformly deposited. The capping layer 34 may be formed to have a thickness of 20 nm or less.

As described above, the capping layer 34 formed of low temperature oxide has low deposition temperature, and thus it does not react with the conductive layer 33 and the gate dielectric layer 32. Therefore, the capping layer 34 does not have an effect on the property of the conductive layer 33 and the gate dielectric layer 32. Furthermore, since the capping layer 34 has low density, the capping layer 34 has a high etch rate and is easily removed.

Figure 6C:
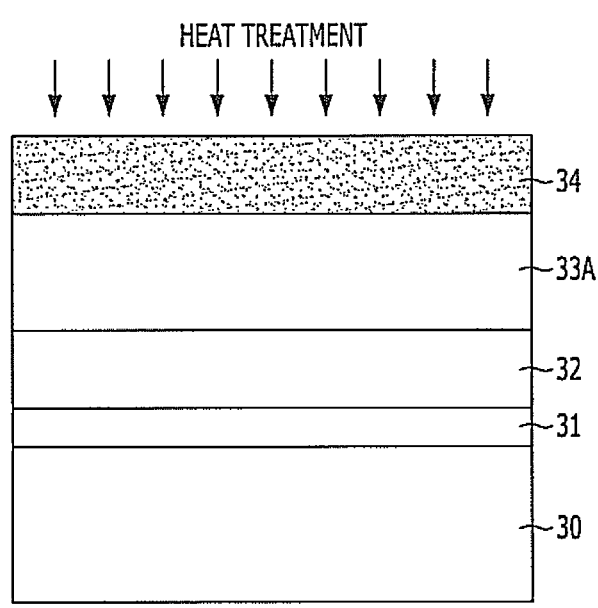

Referring to FIG. 6C, a heat treatment is performed to densify the conductive layer 33A. The heat treatment may be performed at a nitrogen ($N_2$) atmosphere by RTA equipment. Furthermore, the heat treatment may be performed at a temperature of approximately 400° C. to 700° C. At this time, the heat treatment may be performed within one minute.

As the conductive layer 33A is densified by the heat treatment, the surface roughness of the conductive layer 33A and the unevenness of the grain boundary may be improved, and defects may be removed. Furthermore, since the capping layer 34 formed over the conductive layer 33A serves as an oxygen barrier of the gate dielectric layer 32 during the heat treatment, oxygen vacancies may be prevented from occurring in the gate dielectric layer 32.

Figure 6D:
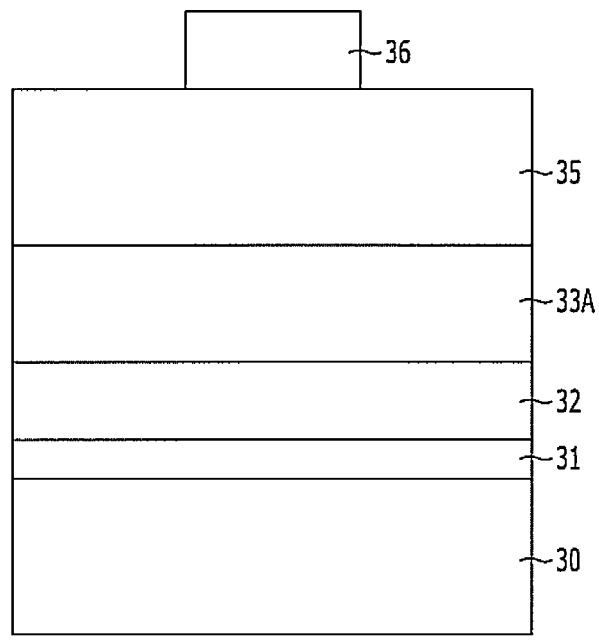

Referring to FIG. 6D, the capping layer 34 is removed. The capping layer 34 may be removed by wet cleaning, and the wet cleaning may be performed using HF, for example. In particular, since the capping layer 34 has low density, the capping layer 34 has a high etch rate and is easily removed.

Then, a hard mask layer 35 is formed over the conductive layer 33A. The hard mask layer 35 serves as an etch barrier for etching the conductive layer 33A and the lower layers and a hard mask of a conductive pattern. The hard mask layer 35 may include nitride, and the nitride may include silicon nitride, for example.

A mask pattern 36 is formed over the hard mask layer 35. The mask pattern 36 defines a conductive pattern area, and it may be formed by coating the hard mask layer 35 with photoresist and patterning the hard mask layer 35 through exposure and development.

Figure 6E:
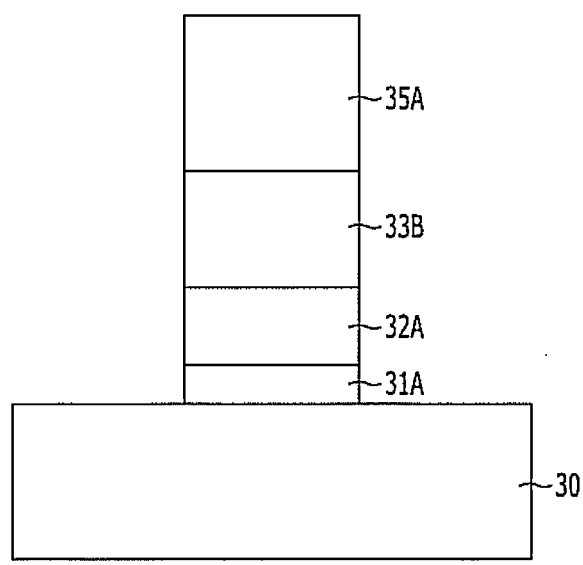

Referring to FIG. 6E, a gate hard mask layer 35A is formed by patterning the resultant structure using the mask pattern 36 as an etch barrier.

The mask pattern 36 is removed. When the mask pattern 36 is formed of photoresist, the mask pattern 36 may be removed by dry etching. The dry etching may include an oxygen strip process.

The conductive layer 33A, the gate dielectric layer 32, and the interface layer 31 are patterned using the gate hard mask layer 35A as an etch barrier.

Therefore, a conductive pattern in which the gate dielectric layers 31A and 32A, the gate electrode 33B, and the gate hard mask layer 35A are stacked is formed over the semiconductor substrate 30.

Figure 7A:
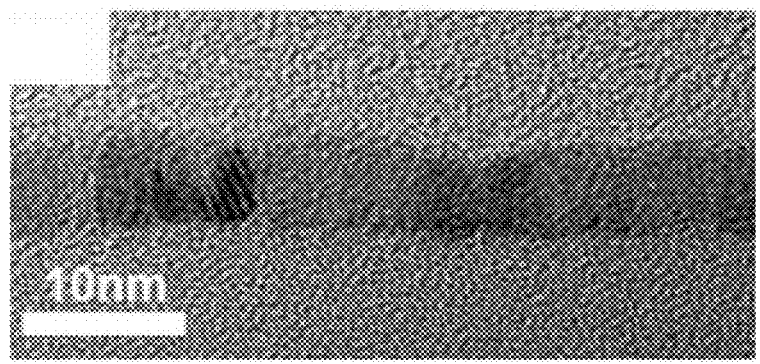
FIGS. 7A and 7B are TEM photographs for comparing surfaces roughnesses of metal layers in accordance with a comparative embodiment and the embodiment of the present invention.
Figure 7B:
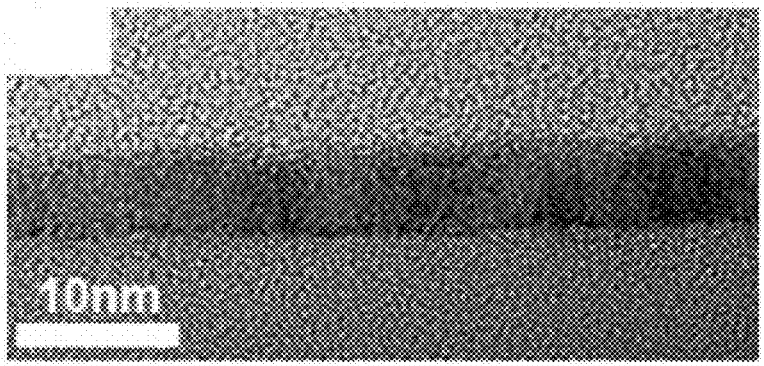

FIGS. 7A and 7B are TEM photographs for comparing surfaces roughnesses of metal layers in accordance with a comparative embodiment and the embodiment of the present invention.

Referring to FIG. 7A, the metal layer formed by ALD has high surface roughness and an uneven grain boundary, and it may include micro defects formed therein.

On the other hand, referring to FIG. 7B, the metal layer subjected to the heat treatment after the formation of the capping layer in accordance with the embodiment of the present invention may be formed as a uniform metal layer of which the surface roughness is improved and in which micro defects are significantly reduced.

FIG. 8 is an atomic force microscope (AFM) diagram for comparing the surface roughnesses of the metal layers in accordance with the comparative embodiment and the embodiment of the present invention.

Referring to FIG. 8, the metal layer in accordance with the comparative embodiment has a p-v value (peak value difference) of 2.833 nm and an RMS (roughness) of 0.251 nm, but the metal layer in accordance with the embodiment of the present invention has a p-v value of 1.546 nm and an RMS of 0.155 nm. That is, the metal layer in accordance with the embodiment of the present invention has an improved quality.

Figure 9A:
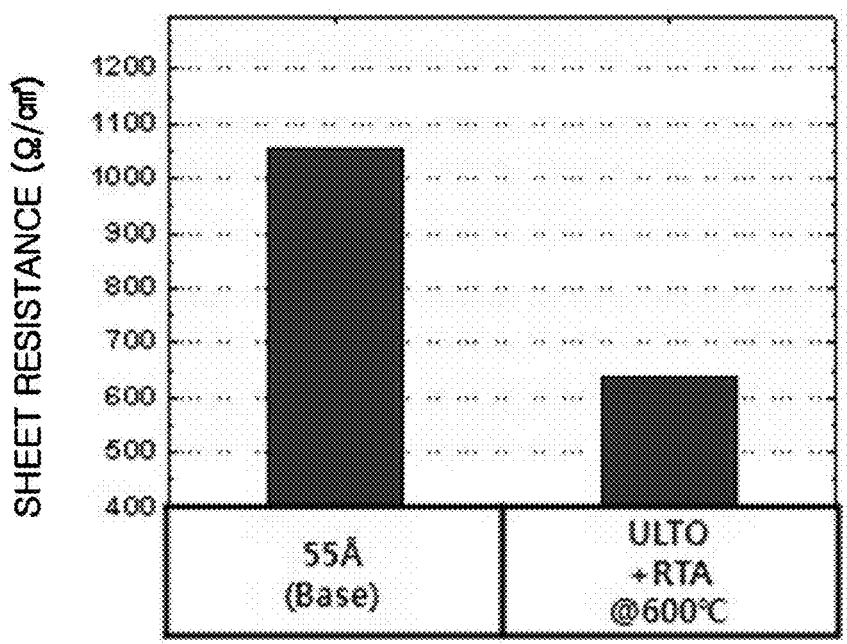
FIGS. 9A to 9C are graphs for comparing the characteristics of the metal layers in accordance with the comparative embodiment and the embodiment of the present invention.
Figure 9B:
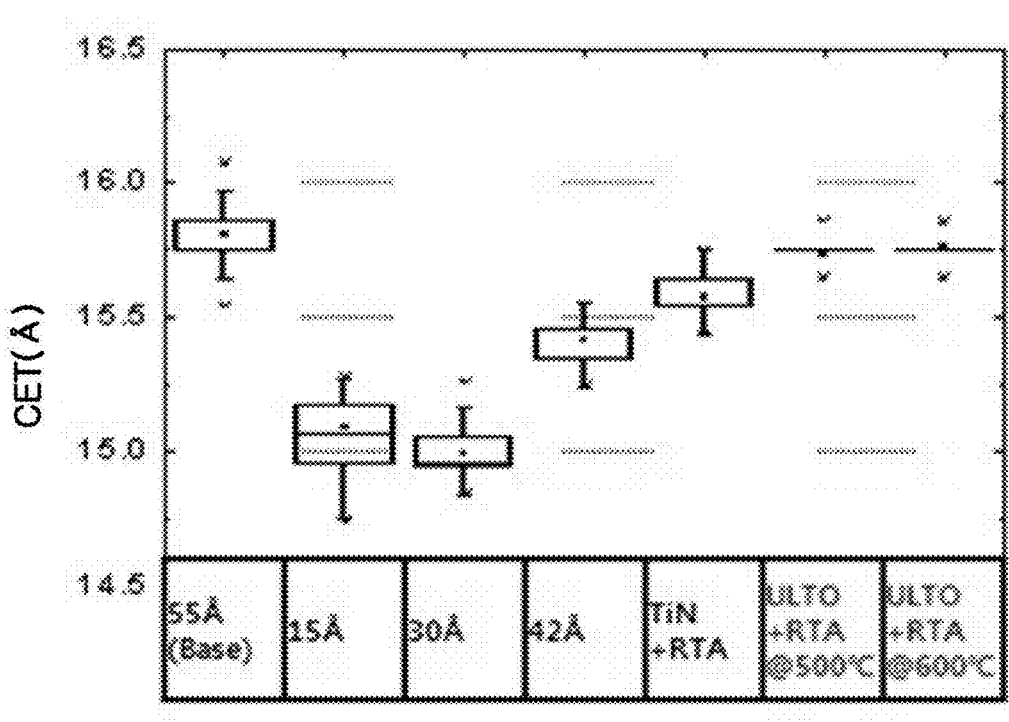
Figure 9C:
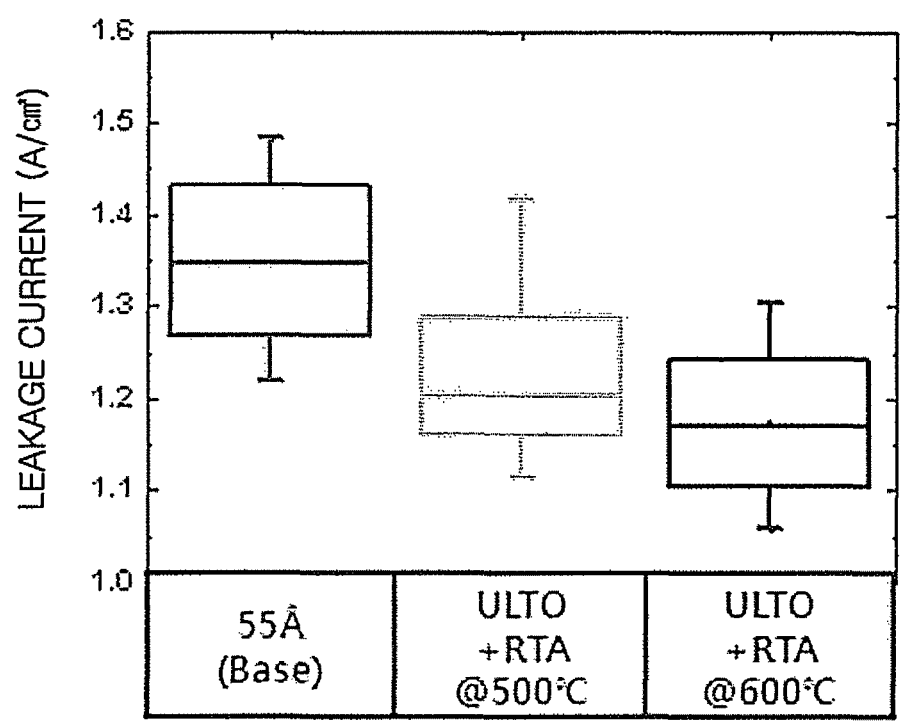

FIGS. 9A to 9C are graphs for comparing the characteristics of the metal layers in accordance with the comparative embodiment and the embodiment of the present invention. FIG. 9A is a graph comparing sheet resistances of the metal layers, FIG. 9B is a graph comparing CETs and those ranges of the metal layers, and FIG. 9C is a graph comparing leakage currents of the metal layers.

Referring to FIG. 9A, the metal layer Base which is not subjected to the post treatment has a sheet resistance of 1,050 $\Omega/cm^2$, but the metal layer subjected to the heat treatment after the formation of the capping layer in accordance with the embodiment of the present invention has a sheet resistance of 640 $\Omega/cm^2$. That is, the sheet resistance of the metal layer in accordance with the embodiment of the present invention decreases approximately 50%. As a result, carrier scattering is suppressed by the improvement of surface roughness and the reduction of defects.

Referring to FIG. 9B, when CETs and those ranges of metal layers having different thicknesses or heat treatment conditions are compared, a metal layer having a thickness of 55 Å, which is not subjected to a heat treatment, has a CET of 15.9 Å and a range of 0.5. Furthermore, a metal layer having a thickness of 30 Å has a CET of 15.0 Å and a range of 0.4, and a metal layer having a thickness of 15 Å has a CET of 15.1 Å and a range of 0.5. Here, it seems that the CET of 15.1 Å of the metal layer having the thickness of 15 Å becomes saturated, and thus, the CET of 15.0 Å of the metal layer having the thickness of 30 Å is substantially the same as the CET of 15.1 Å of the metal layer having the thickness of 15 Å. Furthermore, a metal layer having a thickness of 42 Å has a CET of 15.4 Å and a range of 2.0, and a metal layer subjected to only a heat treatment after the formation of the metal layer without a capping layer has a CET of 15.5 Å and a range of 0.3.

As illustrated in the graph, when the CET of a metal layer decreases as the thickness of the metal layer decreases, it means that oxygen continuously escapes. When the heat treatment is performed, oxygen also continuously escapes.

On the other hand, when RTA is performed after the formation of the capping layer as in the embodiment of the present invention, the metal layers have a CET of 15.8 Å and a range of 0.2, which means that the range decreases 60% or more. That is, since oxygen does not escape when the heat treatment is performed after the formation of the capping layer, the range of the characteristics of the metal layers is improved by the reduction of defects while the CET of the metal layers is maintained.

Referring to FIG. 9C, the metal layer which is not subjected to a post treatment has a leakage current of 1.35 $Å/cm^2$, but the metal layers subjected to the post treatment in accordance with the embodiment of the present invention have leakage currents of 1.21 $Å/cm^2$ and 1.17 $Å/cm^2$, which means that the leakage currents are reduced 11% and 14%, respectively.

In accordance with the embodiment of the present invention, after the metal layer is formed, the capping layer is formed, and the heat treatment is performed, thereby improving the surface roughness of the metal layer and the unevenness of the grain boundary and reducing defects.

As a result, defects of the metal layer and the high-k dielectric layer may be reduced, and electrical characteristics such as Rs resistance and leakage current may be improved without having an effect on the CET.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor, comprising:
    forming a lower electrode;
    forming a dielectric layer over the lower electrode;
    forming an upper electrode metal layer over the dielectric layer;
    forming an upper electrode capping layer over the upper electrode metal layer;
    densifying the upper electrode metal layer through a first heat treatment;
    removing all of the upper electrode capping layer; and
    forming an upper electrode by etching the upper electrode metal layer after all of the upper electrode capping layer is removed,
    wherein the forming of the lower electrode comprises:
        forming a lower electrode metal layer;
        forming a lower electrode capping layer over the lower electrode metal layer;
        densifying the lower electrode metal layer through a second heat treatment;
        removing all of the lower electrode capping layer; and
        forming the lower electrode by etching the lower electrode metal layer after all of the lower electrode capping layer is removed.

2. The method of claim 1, wherein the lower electrode capping layer comprises oxide formed at a temperature of approximately 10° C. to 100° C.

3. The method of claim 1, wherein the second heat treatment is performed at a temperature of approximately 400° C. to 700° C. under a nitrogen ($N_2$) atmosphere by rapid thermal annealing (RTA) equipment.

4. The method of claim 1, wherein the upper electrode comprises titanium nitride.

5. The method of claim 1, wherein the upper electrode metal layer comprises titanium or a stacked structure of titanium and titanium nitride.

6. The method of claim 1, wherein the upper electrode capping layer comprises oxide formed at a temperature of approximately 10° C. to 100° C.

7. The method of claim 1, wherein the first heat treatment is performed at a temperature of approximately 400° C. to 700° C. under a nitrogen ($N_2$) atmosphere by rapid thermal annealing (RTA) equipment.

* * * * *